United States Patent [19]

Hugenholtz

[11] 3,904,980

[45] Sept. 9, 1975

[54] DISPLACED SPECTRUM FREQUENCY SYNTHESIZER

[76] Inventor: Eduard Herman Hugenholtz, 16 Brucedale Cres., Willowdale, Ontario, Canada

[22] Filed: Apr. 24, 1974

[21] Appl. No.: 463,492

[30] Foreign Application Priority Data

Apr. 26, 1973 United Kingdom.............. 19843/73

[52] U.S. Cl. ........................ 331/4; 331/19; 331/22; 331/25; 331/31

[51] Int. Cl.$^2$............................................ H03B 3/04

[58] Field of Search ................ 331/4, 19, 22, 25, 31

[56] References Cited

UNITED STATES PATENTS

| | | | |
|---|---|---|---|
| 3,268,831 | 8/1966 | Noordanus et al. | 331/19 X |
| 3,320,546 | 5/1967 | Allen et al. | 331/22 |
| 3,694,766 | 9/1972 | Boelke | 331/19 X |

*Primary Examiner*—Siegfried H. Grimm

*Attorney, Agent, or Firm*—Rogers, Bereskin & Parr

[57] ABSTRACT

This invention relates to a frequency synthesis system in which the frequency of a controllable oscillator is phase-locked to a frequency equal to the frequency of a selected harmonic in a first harmonic spectrum containing harmonics of a primary reference frequency. Circuit means are provided for tuning the frequency of the controllable oscillator across a predetermined frequency range which includes a portion of the first harmonic spectrum. A feedback control circuit, operable by an enabling signal, is used for generating a control signal when the enabling signal is present. The control signal inhibits tuning and phase-locks the controllable oscillator on the selected harmonic. To ensure that the controllable oscillator is phase-locked on the correct harmonic in the first harmonic spectrum a second harmonic spectrum containing harmonics of an auxiliary reference frequency is generated. The auxiliary reference frequency is related to the primary reference frequency in a predetermined manner so that related harmonics in each frequency spectrum differ by a frequency having a fixed preselected value only when the controllable oscillator is phase-locked to the selected harmonic in the first harmonic spectrum. Circuit means responsive to a signal having a frequency equal to the preselected frequency are provided for generating the enabling signal thereby phase-locking the frequency of the controllable oscillator to the frequency of the selected harmonic in the first harmonic spectrum.

13 Claims, 7 Drawing Figures

DISPLACED SPECTRUM FREQUENCY SYNTHESIZER

This invention relates to a frequency synthesis system wherein the generation of an adjustable frequency derived from a stable crystal controlled oscillator is achieved.

In a known class of frequency synthesis systems the frequency of a controllable oscillator is phase-locked on a selected harmonic of the frequency spectrum contained in a pulse train of precisely known fundamental frequency. This is accomplished by suitably mixing the controllable oscillator output signal with the harmonic rich pulse train in a mixer and providing means for deriving a control signal from the resulting mixer output signal. The frequency of the controllable oscillator may thus be locked directly onto a harmonic of the fundamental frequency of the pulse train or if desired onto a frequency slightly offset from such a harmonic. In the latter case the best frequency between the frequency of the controllable oscillator and the nearest harmonic of the fundamental frequency in the frequency spectrum is locked onto an offset frequency. As a result the output frequency of the controllable oscillator will differ from the frequency of the nearest harmonic in the frequency spectrum by an amount equal to the offset frequency.

In the aforementioned systems, the conditions necessary to achieve a stable phase-lock repeat for each harmonic in the pulse train. In order to select the desired output frequency the controllable oscillator must be tuned sufficiently close to the desired harmonic in the frequency spectrum to ensure that the output frequency of the controllable oscillator comes within the capture range of the system, thereby ensuring an unambiguous phase-lock on the desired harmonic frequency. When operating at high frequencies the tuning of the controllable oscillator can become critical and, to safeguard against phase-locking on an unwanted harmonic, rather complex circuit configurations may be required.

A known system which overcomes this problem comprises a controllable oscillator having an output frequency which can be varied by a control signal and two reference frequency generators whose fundamental frequencies can be varied. Each reference frequency generator drives a pulse generator having an output signal which contains a broad frequency spectrum. The output signals from the controllable oscillator and the first pulse generator are applied to a mixer. Means are provided for deriving a control signal from the mixer output which is used to vary the frequency of the controllable oscillator. A second control signal is similarly derived from a second mixer to which the outputs from the controllable oscillator and the second pulse generator are applied. This first control signal locks the frequency of the controllable oscillator to a selected harmonic of the fundamental frequency of the first reference frequency generator and the second control signal inhibits the controllable oscillator from locking onto a harmonic of the first reference frequency generator which does not have a predetermined relationship with harmonics of the fundamental frequency of the second reference frequency generator. Thus, a phase-lock is only possible when the output frequency of the controllable oscillator simultaneously coincides in a predetermined manner with the related harmonics of each reference frequency.

If the controllable oscillator is required to oscillate at a frequency which is different from a harmonic of the frequency of the first reference frequency generator an offset signal having a selected frequency can be introduced into the system. The offset signal is used to displace the frequency of the harmonics of each reference frequency generator by the selected offset frequency. In this case a phase-lock occurs when the output frequency of the controllable oscillator simultaneously coincides in a predetermined manner with related displaced harmonics of each reference frequency.

To avoid the need for manual tuning an automatic hunting circuit may be employed. The hunting circuit sweeps the controllable oscillator slowly across its frequency range until the required conditions for a phase-lock occur. When a phase-lock is achieved the hunting oscillator is disabled.

The aforementioned frequency synthesis system is subject to a number of restrictive limitations, some of which are summarized as follows:

a. a synchronous relationship between the fundamental frequency of one of the reference generators and the difference in the fundamental frequencies between both reference generators is required for direct phase-lock on a harmonic, and in the case of an offset frequency a synchronous relationship between the offset frequency and the difference in the fundamental frequencies between both generators is necessary. This results in a need to employ phase discrimination rather than frequency discrimination, which due to the intrinsic loop stability problems associated with phase-lock loops makes the circuit design more complicated.

b. due to the possible phase modulation of the second reference frequency generator used to inhibit a phase-lock of the controllable oscillator to a harmonic of the fundamental frequency of the first reference frequency generator, phase-locking once established may be inadvertently broken with the result that this system cannot be used in phase-modulated or frequency-modulated equipment.

c. the output circuitry for the second mixer must have broad band characteristics in order to ensure inhibit action for the various frequencies which can occur for harmonics of the fundamental frequency of the reference generator to which the controlled oscillator is phase-locked.

d. since a phase-lock can occur only when the beat frequency from the second mixer drops below a certain minimum voltage level, the lock-in time may be relatively long.

The above limitations may be overcome by appropriate circuit design. However, the circuitry required tends to increase the overall complexity of the system.

Accordingly, it is an object of the present invention to provide a frequency synthesis system which overcomes the aforementioned limitations with a minimum of circuit complexity.

According to a particular preferred embodiment of the present invention, the frequency of a controllable oscillator, tunable across a predetermined frequency range, is phase-locked by a control signal to a frequency equal to that of a selected harmonic in a first harmonic spectrum. The first harmonic spectra may be generated by a stable crystal controlled primary reference frequency oscillator coupled to a first pulse generator for producing pulses having a high harmonic content. The controllable oscillator and the first pulse generator are coupled to a first comparing circuit.

The first comparing circuit is operable by a gating signal to produce an output signal when the controllable oscillator is tuned to a frequency equal to or within a prescribed frequency range centered about the selected harmonic frequency. The first comparing means when operated produces an output signal which is used to generate a control signal having a unique value when the frequency of the controllable oscillator equals the selected harmonic in the first harmonic spectrum. The control signal is coupled to the controllable oscillator for phase-locking it to a frequency equal to the frequency of the selected harmonic.

In order to ensure that the controllable oscillator is phase-locked on the proper harmonic in the first harmonic spectrum, a second harmonic spectrum is generated. The second harmonic spectrum may be produced by a controllable auxiliary reference frequency oscillator and a second pulse generator. For any selected harmonic in the first harmonic spectrum, a second frequency control circuit establishes the frequency of the auxiliary oscillator at a value so that only one particular harmonic in the second harmonic spectrum differs from the selected harmonic in the first harmonic spectrum by a predetermined fixed frequency.

Second comprising means are coupled to the controllable oscillator and to the second pulse generator to produce an output signal having a frequency which equals the predetermined fixed frequency when the controllable oscillator frequency is simultaneously equal to the frequency of the selected harmonic in the first harmonic spectra and to the frequency of the particular harmonic in the second harmonic spectra displaced by the predetermined frequency. When this condition exists the output signal from the second comparing means operates a gate circuit which produces the gate signal for operating the first comparing means. The control signal generated by the first comparing means causes the controllable oscillator frequency to phase-lock on the correct harmonic in the first harmonic spectra.

A sweeping circit is coupled to the controllable oscillator to tune it across the first harmonic spectrum until the selected harmonic is reached and a phase-lock occurs.

Further objects and advantages of the present invention will appear from the following description taken together with the accompanying drawings, in which.

Figures 1, 2:
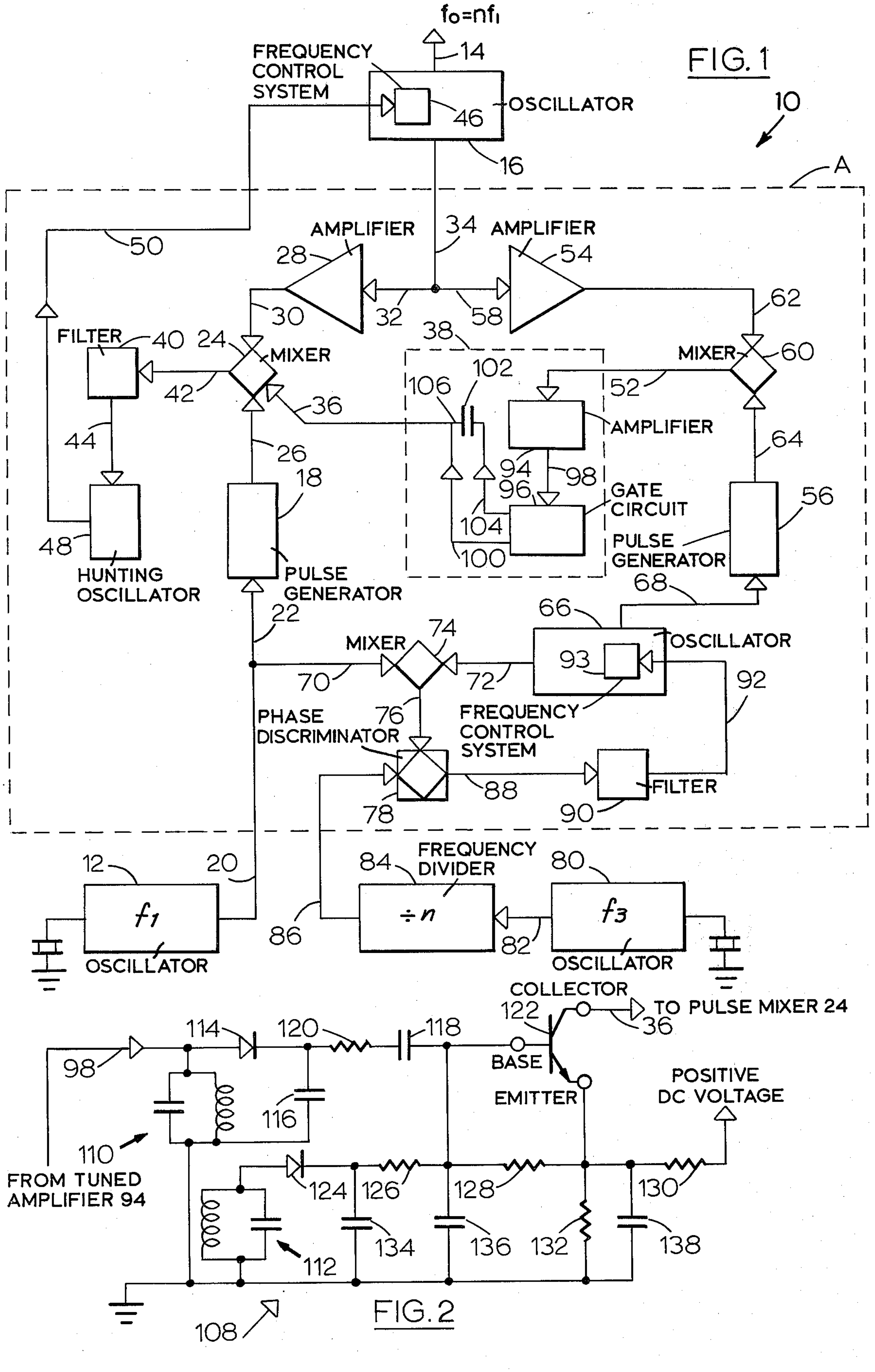
FIG. 1 is a block diagram of a frequency synthesis system adapted for direct phase-lock on a selected harmonic of a primary reference frequency source according to the present invention.
FIG. 2 is a schematic diagram of a frequency selective gate circuit.

Reference is first made to FIG. 1 which shows a direct-lock frequency synthesis system, in block diagram form, generally indicated by numeral 10. The system 10 includes a conventional crystal controlled oscillator 12 which produces a primary frequency $f_1$. Frequency $f_1$ may also be supplied from an external frequency source such as a primary frequency standard. The system also includes a voltage controlled oscillator 16 the output of which appears on line 14 as a signal having a frequency $f_0$. The object of the system is to phase-lock output $f_0$ to a selected harmonic of $f_1$.

The signal from oscillator 12 is fed to a conventional pulse generator 18, via lines 20, 22. The pulse generator 18 is preferably a multi-vibrator circuit or a schmitt-trigger followed by a pulse sharpening circuit, both of which are conventional in the art. Pulse generator 18 transforms the output signal of oscillator 12 into a harmonic rich pulse train having a fundamental frequency $f_1$. The harmonics in this pulse train form a first harmonic spectrum.

The pulse train signal from pulse generator 18 is fed to a first pulse mixer 24 via line 26. The pulse mixer 24 also receives a signal from an amplifier 28 via line 30. The signal from amplifier 28 is derived from the output signal of oscillator 16 via lines 32 and 34. The primary purpose of amplifier 28 is to isolate oscillator 16 from pulse mixer 24 to prevent detuning the oscillator. In addition, pulse mixer 24 is controllable (in the sense of being enabled or inhibited) by a signal on line 36 generated by a frequency selective gate, generally indicated by numeral 38 (to be described more fully below). Unless an appropriate signal is generated by gate 38 pulse mixer 24 remains inhibited.

Enabling or inhibiting pulse mixer 24 may be accomplished by conventional means familiar to those skilled in the art. For example, pulse mixer 24 may be a balanced or unbalanced diode mixer in which the diodes are normally biased to an 'OFF' condition unless gate 38 generates an appropriate signal on line 36. Alternatively, the signal from gate 38 can be used to enable amplifier 28 which in this case would normally be inoperative thereby preventing the appearance of a signal on line 30.

When the signal on line 36 enables mixer 24 the mixer output signal is directed to a low pass filter 40 via line 42. The output signal from filter 40 is rectified and adjusted in level by conventional means (not shown). The resulting slowly varying DC level is fed via line 44 to a hunting oscillator 48 and then by means to be described, via line 50 to a frequency control system 46 which is part of oscillator 16. Frequency control system 46 is conventional and known to those skilled in the art. For example the frequency control system may be one of the known varactor diode control systems and may involve the tuning of related circuits (not shown) as well as oscillator 16.

A hunting signal is also injected into control line 50. This signal is typically a 50 to 100 cycle per second periodic saw-tooth voltage generated by hunting oscillator 48. The hunting signal when applied to the frequency control system 46 of oscillator 16 causes this oscillator to sweep through its frequency range. The hunting action continues until the output frequency $f_0$ of oscillator 16 is phase-locked on the selected harmonic in the first frequency spectrum generated by pulse generator 18. Once a positive phase-lock has occurred, hunting oscillator 48 is inhibited in a manner to be described by the presence of the signal on line 44. While oscillator 16 is phase-locked to the selected harmonic of $f_1$, frequency selective gate 38 will produce an output signal on line 36 thereby enabling pulse mixer 24. If the phase-lock is lost or a different output frequency is selected, the gate signal on line 36 temporarily disappears thereby inhibiting mixer 24 and allowing the hunting action to resume until a phase-lock is reacquired on the same harmonic of $f_1$ in the first case or on a new harmonic of $f_1$ in the latter case.

The rate at which hunting oscillator 48 sweeps the frequency of oscillator 16 across its frequency range must be controlled to allow sufficient time for a positive phase-lock to occur. The precise sweep rate depends on the overall control loop characteristics of the frequency synthesis system since a finite capture time is required due primarily to the time constant of frequency selective gate 38 and filter 40. The circuit criteria required to design a stable phase-lock loop are well known to those skilled in the art.

In the system described thus far the conditions required for a positive phase-lock repeat for each harmonic of the primary reference frequency $f_1$ present in the first frequency spectrum generated by pulse generator 18. The precise method employed to ensure that a phase-lock on the desired harmonic of $f_1$ will occur is now described.

Two signals, one derived from amplifier 54 and one from a second pulse generator 56 (to be described) are directed to gate 38 via line 52. Amplifier 54 is coupled to oscillator 16 via lines 34 and 58. The signals from amplifier 54 and a pulse generator 56 are coupled to pulse mixer 60 via lines 62 and 64 respectively.

An auxiliary controllable oscillator 66 is coupled to pulse generator 56 via line 68. The output signal of oscillator 66 has a frequency $f_2$ which is controllable over a limited frequency range by means to be described. Like pulse generator 18 pulse generator 56 produces a pulse train signal having a high harmonic content. The harmonics in this pulse train form a second harmonic spectrum.

The output signal from pulse mixer 60 is a beat signal between $f_0$ and the nearest harmonic to $f_0$ contained in the second harmonic spectrum on line 64. The beat signal has a variable frequency $f_b$ and when the frequency $f_b$ lies within the passband of frequency selective gate 38, a control signal appears on line 36 enabling pulse mixer 24 as described.

The frequency of the signal generated by oscillator 66 is controlled by a programming system described below. When $f_0$ is coincident with the desired harmonic of $f_1$ the beat frequency $f_b$ from pulse mixer 60 is a frequency $f_4$ ($f_4$ to be defined) which lies within the frequency passband of gate 38. When this condition occurs pulse mixer 24 is enabled by the signal on line 36 generated by gate 38.

Oscillator 66 is programmed by first mixing signals coupled from oscillator 12 and from oscillator 66, on lines 70 and 72 respectively, in a conventional mixer 74. The output signal from mixer 74 appears on line 76 and has a frequency $\pm(f_1-f_2)$. It will be apparent to those skilled in the art that either difference frequency may be used. The desired difference frequency may be selected by filtering the output signal from mixer 60. In the description to follow the difference frequency $(f_1-f_2)$ is assumed.

The signal having a frequency $(f_1-f_2)$ on line 76 is then coupled to a phase discriminator 78. A crystal controlled programming oscillator 80 generates a programming frequency $f_3$ which is directed via line 82 to a programmable frequency divider 84. Frequency divider 84 divides the input frequency $f_3$ by a factor n so that the signal on line 86 has a frequency $f_3/n$. Phase discriminator 78 compares the signals $(f_1-f_2)$ and $f_3/n$ and produces a slowly varying DC output signal on line 88 which is proportional to the phase difference between $(f_1-f_2)$ and $f_3/n$. The signal on line 88 is directed into a second low pass filter 90 having an output on line 92 which provides a signal for a frequency control system 93 which is part of oscillator 66. The control loop comprising elements, 66, 74, 78, 80, 84, and 90 is designed to synchronize oscillator 66 to a condition in which $f_1-f_2=f_3/n$.

To ensure a phase-lock condition for the various possible values of $n$, discriminator 78 may be a combination frequency and phase discriminator. In this case the frequency discriminator portion of discriminator 78 brings $(f_1-f_2)$ to a value close to $f_3/n$ thereby ensuring that both frequencies are within the lock-in range of the phase discriminator portion of discriminator 78.

To ensure an exclusive phase-lock on the nth harmonic of $f_1$ various combinations of $f_3$ and division ratios can be used. In a simple configuration the programming frequency $f_3$ is set equal to the frequency $f_4$, and divider 84 is programmed for a division ratio $n$. Thus, the condition required for synchronization of oscillator 66 is $f_1-f_2=f_4/n$. When this condition is met the beat frequency $f_b$ between $f_0$ and $nf_2$ is $f_4$ and gate 38 enables pulse mixer 24.

An important consideration in this system is to ensure that $f_0$ cannot be phase-locked on another harmonic of $f_1$ within the control range of oscillator 16. In relation to the adjacent harmonics of $f_1$, namely $(n \pm 1)$. $f_1$ it can be shown that $f_b$ will differ from $f_4$ by a value $f_4/n$. Consequently, the passband of frequency selective gate 38 must be less than $\frac{1}{2}(f_4/n)$, for the largest value of n used, in order to ensure that the system will not lock onto an adjacent harmonic of $f_1$.

If the passband of gate 38 is designated as $b \cdot f_4$ this represents the frequency range within which $f_b$ must be located in order to enable pulse mixer 24. Assuming that this passband is located symmetrically about $f_4$ extending from a frequency $f_4-(b/2)\cdot f_4$ to a frequency $f_4+(b/2)\cdot f_4$, the condition $f_4/n > (b/2)\cdot f_4$ must be satisfied to ensure that a phase-lock cannot occur on adjacent harmonics of $f_1$. In a practical case, taking into account asymmetry of the passband and a tolerance factor in the frequencies involved the condition may be stated as $f_4/n \geq bf_4$, where the harmonic number $n$ relates to the highest harmonic of $f_1$ on which a phase-lock is required. For this particular harmonic the ratio $f_4/n$ has its lowest value. For example, if $n$ equals 150 then $$\frac{b \cdot f_1}{f_4}$$

must be less than or equal to 1/150.

Another lock-in condition can occur for a substantially different value of $f_0$. If the harmonic number for this alternate lock-in frequency is indicated by m for $f_1$ and by $(m+p)$ for $f_2$, then the condition for such a secondary locking point on an image frequency of $f_4$ is, $mf_1 + f_4 = (m+p)f_2$. Considering also the relationship $f_1 - f_2 = f_4/n$ leads to the result that, $$\frac{m}{n.p} = \frac{f_1}{f_4} - \frac{1}{p} - \frac{1}{n}$$

or for $p = 1$, $m/n = f_1/f_4 - 1 - 1/n$. This indicates that a secondary lock-in frequency will be more remote for higher values of $f_1/f_4$ which in turn implies lower values of $f_4$. However, decreasing $f_4$ results in a narrower passband for gate 38 which in turn results in a relatively longer lock-in time and consequently requires a reduced hunting rate. For most practical applications a value of $f_1/f_4$ lying in the range between 1 and 5 will be satisfactory. This provides protection against a secondary lock-in over frequency range of more than 3:1 which represents a practical goal.

In those cases where a relatively fast selection of a new frequency is required, the lock-in time can be reduced by employing a two-step frequency selective gate. In this arrangement, the frequency selective gate circuit comprises an amplifier having a passband considerably wider than that of the gating circuit which it drives. The gating circuit is provided with two frequency selective circuits, one of relatively wider bandwidth than the other. A rectified component of the wide band signal is capacitively coupled into line 36 in addition to a direct coupled signal derived from the narrow band signal. As a result, the frequency selective gate circuit provides an enable signal to pulse mixer 24 over a considerably wider bandwidth. This results in the termination of the hunting action and hence a tentative phase-lock. However, if the harmonic to which oscillator 16 is locked is not the correct one, the phase-lock will not be confirmed by the direct coupled signal resulting in a continuation of the hunting action after the coupling capacitor has been discharged.

Referring again to FIG. 1 and in particular to frequency selective gate 38, the operation of this portion of the system in various forms will now be described. In one form, frequency selective gate 38 comprises a tuned amplifier 94, having a passband $bf_4$, and a gating circuit 96. Amplifier 94 derives its input signal via line 52 and is connected to gating circuit 96 by line 98. The output gating signal is directed to pulse mixer 24 via lines 100 and 36 respectively. When an output gating signal exists, pulse mixer 24 is enabled and lock-in will occur. This condition prevails when beat signal frequency $f_b$, generated by pulse mixer 60, lies within the passband $b{\cdot}f_4$ of tuned amplifier 94.

In a second form, adapted to provide fast selection of a new frequency, frequency selective gate 38 comprises in addition to those elements described above a capacitor 102 coupled via line 104 to gating circuit 96. Capacitor 102 feeds pulse mixer 24 via lines 106 and 36. In addition, the bandwidth of the tuned amplifier 94 is increased so it is considerably wider than $b{\cdot}f_4$ and gating circuit 96 is provided with a two-step operation by means of the inclusion of a dual passband circuit to be described.

The operation of the second form of frequency selective gate can be described as follows. A signal from tuned amplifier 94 (having an increased bandwidth as described above) enters the gating circuit 96 via line 98. A rectified wideband component of this signal is capacitively coupled through gating circuit 96 via line 104 to capacitor 102. The signal is then directed, as described, to pulse mixer 24. In addition, a rectified narrow band component of the input signal on line 98 is directly coupled through gating circuit 96 and directed to pulse mixer 24 via lines 100 and 36. As a result, the frequency selective gate 38 will activate the phase-lock system associated with oscillator 16 to lock-in on the selected harmonic of the frequency spectrum generated by pulse generator 18 over a considerably increased bandwidth. This causes the hunting action to terminate and a tentative phase-lock occurs. However, if the harmonic concerned is not the correct one then the phase-lock will not be confirmed by the direct coupled narrow band gating circuit signal on lines 100 and 36. As a result, after capacitor 102 has discharged, the output of gate 38 on line 36 will disappear and pulse mixer 24 will be inhibited causing hunting to resume.

A preferred embodiment of the dual passband circuit employed in the two-step gating circuit is shown in schematic diagram form in FIG. 2. The dual passband circuit, generally indicated by reference numeral 108, receives an input signal via line 98 from tuned amplifier 94. The input signal is fed to a tuned circuit 110 and is inductively coupled into a second tuned circuit 112. Due to the double filtering the bandwidth of tuned circuit 110 is wider than the bandwidth of tuned circuit 112. The signal from tuned circuit 110 feeds diode 114 which rectifies the signal and provides a positive rectified voltage across capacitor 116. The voltage on capacitor 116 charges capacitor 118 (which generally corresponds to capacitor 102 in FIG. 1) via resistor 120 causing a positive voltage to appear at the base of transistor 122. The collector voltage of transistor 122 provides the required signal on line 36 to enable pulse mixer 24, allowing the phase-lock system to operate as described. The enabled state lasts as long as capacitor 118 is charged.

The narrow band tuned circuit 112 is connected to a diode 124. Diode 124 is reversed-biased via resistors 126 and 128 due to the positive emitter voltage of transistor 122. The positive emitted voltage is generated by a resistive divider consisting of resistors 130 and 132. The resistive divider is connected to a positive voltage (not shown). Consequently, diode 124 will conduct only when the peak voltage level of the signal across tuned circuit 112 exceeds the reverse-bias voltage. When this occurs a positive voltage exceeding the reverse-bias voltage appears across capacitor 134, where it is directed via resistor 126 to a capacitor 136 and then to the base of transistor 122. This causes transistor 122 to remain in the ON state (conducting) as long as the signal from tuned circuit 112 is present. As a result, mixer 24 will remain enabled if oscillator 16 is phase-locked on the correct harmonic. Capacitor 138 acts as a filter smoothing out any rapid voltage variations that appear at the emitter of transistor 122.

Another method which may be employed to provide an increased hunting rate is to set the output frequency $f_3$ of oscillator 80 to $f_1 \pm f_4$ instead of $f_4$. This results in a difference by one step between the divider ratio and the harmonic number of the selected harmonic of $f_1$. As a result $nf_2 = (n-1)f_1 - f_4$ rather than $nf_2 = nf_1 - f_4$ as previously.

This method is particularly useful in cases where a high harmonic number and a limited frequency range are concerned, conditions which in practice often coincide. In the case where $f_1 - f_4 = 2f_4$ the permissible gate frequency is doubled, however, the operating frequency range of controllable oscillator 16 is restricted to slightly less than 2:1 in order to avoid locking on the next higher harmonic. For higher valuess of $f_1/f_4$ the relative gate bandwidth can be increased even more. In this case the frequency range is still slightly less than 2:1 provided means are used to prevent a phase-lock on an image frequency $f_1 + f_4$ instead $f_1 - f_4$.

Preventing a phase-lock on an image frequency can be accomplished by a special gating circuit (not shown) used in conjunction with a strictly unidirectional hunting system. An image rejecting gate may make use of the fact that for the undesired image frequency the frequency $f_4$ is approached in the opposite direction than for the desired frequency. Lock-in can be prevented by employing either a frequency discriminator in the gating circuit or by using an offset tuned circuit followed by a detector circuit. In both cases an approach from the wrong direction causes a voltage to be generated which is used to inhibit the gating circuit. The voltage once generated is held for a brief period. Thus, in the case of an image locking point such a circuit inhibits gating action until the potential locking point has been passed after which stable locking on this frequency cannot occur. The use of an image selective phase discriminator is well known to those skilled in the art and many ways of constructing such a circuit are possible.

Figure 3:
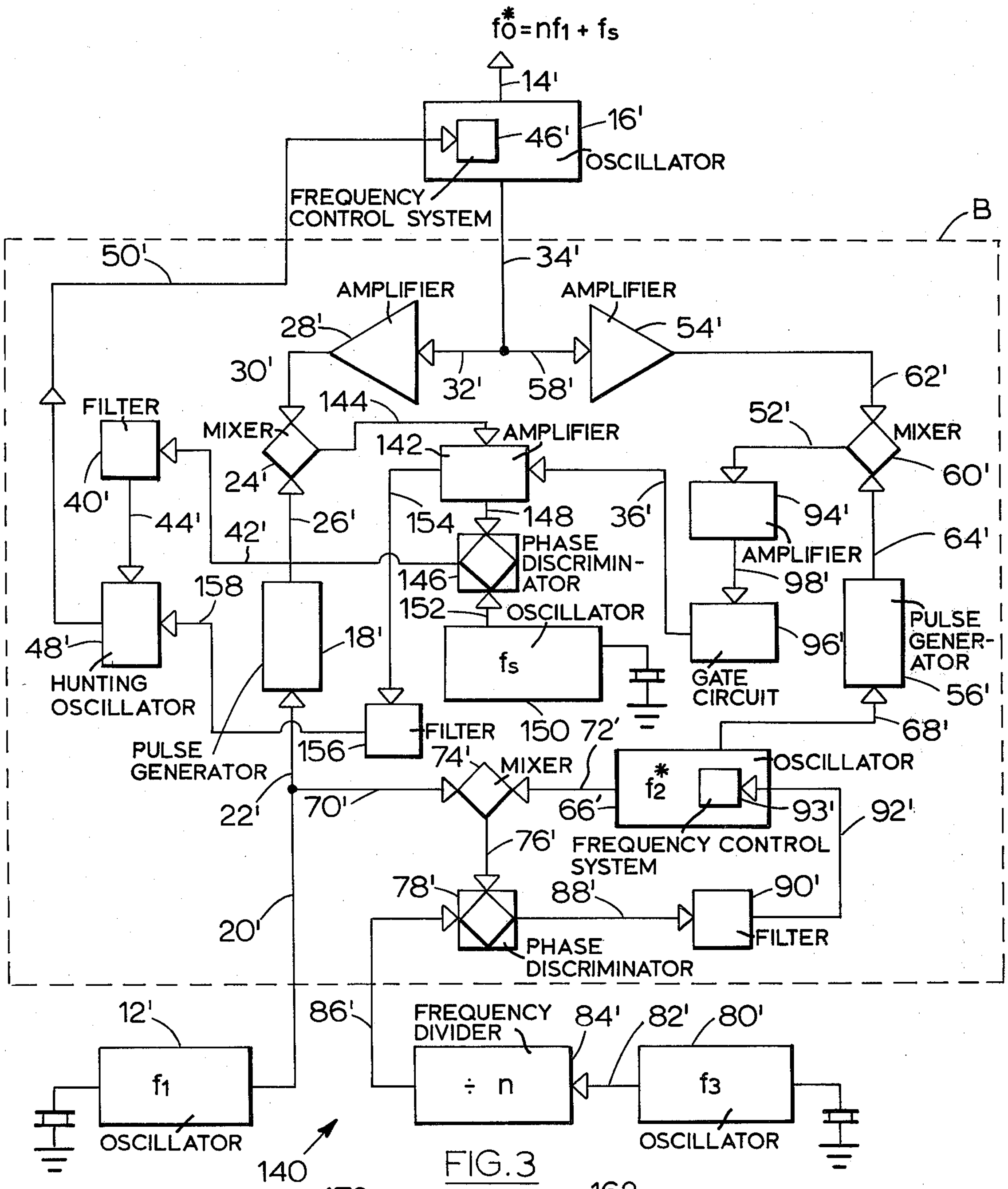
FIG. 3 is a block diagram of a frequency synthesis system similar to that shown in FIG. 1 but including means to inject an offset frequency and, in addition, means for reducing the frequency selection time.

In the embodiment of the present invention, shown in block diagram form in FIG. 3, a frequency synthesis system 140 is shown in which the output frequency of a controllable oscillator is locked onto a frequency offset by a fixed offset frequency $f_s$ from a selected harmonic of the primary reference frequency $f_1$. In most cases $f_s$ is a substantially lower frequency relative to the frequency $f_1$. Since the frequency synthesis system shown in FIG. 3 is similar to the system of FIG. 1, similar elements in FIG. 3 are designated by primed reference numerals used in FIG. 1 allowing the elements in FIG. 3 to be directly related to their counterparts in FIG. 1.

Reference oscillator 12' produces primary reference frequency $f_1$. The output of oscillator 16' is to be phase-locked on a frequency which is equal to a harmonic frequency of $f_1$ displaced by the offset frequency $f_s$.

Oscillator 12' feeds pulse generator 18' which generates a pulse train having a frequency $f_1$. The pulse train from pulse generator 18' is directed via line 26' to pulse mixer 24'. Pulse mixer 24' also receives a signal having a frequency of $f_0$ from oscillator 16'.

A beat signal $f_{bm}$ generated by pulse mixer 24' is directed to a gated selective amplifier 142 via line 144. The output signal from amplifier 142 is coupled to a phase discriminator 146 via line 148.

A second auxiliary crystal controlled oscillator 150 is employed to generate a signal having the frequency $f_s$. Oscillator 150 is coupled to phase discriminator 146 by line 152.

The selective amplifier 142 is enabled or inhibited by the gate signal on line 36'. When the gate signal is present on line 36' selective amplifier 142 is enabled (turned ON) and a signal of frequency $f_{bm}$ appears at an input of phase discriminator 146. In the absence of a gate signal on line 36' the phase discriminator does not receive an input signal. The output of phase discriminator 146 appears on line 42' and is directed via low pass filter 40', line 44' and hunting oscillator 48' to the frequency control system 46'.

Phase discriminator 146 may alternatively consist of a frequency discriminator having a center frequency equal to the offset frequency $f_s$. The DC output voltage from the frequency discriminator is applied to controlled oscillator 16', in the manner described above with reference to phase discriminator 146, causing the oscillator 16' to oscillate at a frequency so that $f_{bm}$ at the output of selective amplifier 142 is equal to $f_s$. Because the frequency discriminator is generally conventional in form and familiar to those skilled in the art it is not shown. However, a dual section frequency discriminator in which one section operates using a relatively wideband tuned circuit and the second section uses a quartz crystal thereby providing a limited frequency range with a high degree of frequency accuracy and stability is preferred.

A low frequency hunting signal generated by hunting oscillator 48' is directed to the frequency control system 46' in oscillator 16' via line 50'. Hunting oscillator 48' is designed so that when a phase-lock occurs the hunting action is inhibited. A relatively small negative voltage formed by rectifying a component of the output signal of selective amplifier 142 is directed via line 154, circuit element 156 and line 158 to hunting oscillator 48'. This signal serves to slow down the hunting action, in a manner to be described, as soon as amplifier 142 is enabled by the gate signal on line 36'. Slowing down the hunting rate facilitates a phase-lock between the frequency $f_0^*$ and the desired harmonic of $f_1$ displaced by the offset frequency $f_s$. Thus, when a phase-lock occurs when $f_0^* = nf_1 \pm f_s$.

In the system described $f_s$ is produced by oscillator 150. However, $f_s$ can also be derived from oscillator 12' followed by a fixed frequency divider (not shown).

The following description of the offset frequency synthesis system is related to the particular system which permits a phase-lock to occur on a selected harmonic of the primary reference frequency $f_1$ resulting in an output frequency of $f_0^* = nf_1 + f_s$. It will be obvious to those skilled in the art that the system could also be arranged so that $f_0^*$ equals $nf_1 - f_s$.

A signal having a frequency $f_2^*$ is generated by oscillator 66' which is controlled by a programming system. As described above, in relation to FIG. 1, the programming system ensures that $f_0^*$ is phase-locked to the selected harmonic of $f_1$ displaced by the offset frequency $f_s$. When oscillator 16' is phase-locked on the proper frequency, the beat signal produced by mixer 60' has a frequency $f_4$ which lies within the passband of amplifier 94'. The gating signal on line 36' enables amplifier 142 allowing the frequency control system 46' associated with oscillator 16', to lock $f_0^*$ to a frequency $nf_1 + f_s$.

Oscillator 66' is programmed in the same manner as oscillator 66 in FIG. 1. However, in this case the output signal from mixer 74', appearing on line 76', has a frequency $f_2^* - f_1$, and the frequency $f_3$ produced by programming oscillator 80' is set equal to $f_4 + f_s$. The phase discriminator 78' compares the phases of the signals on lines 76' and 86' having frequencies $f_2^* - f_1$ and $$\frac{f_4 + f_s}{n}$$

respectively. The output from phase discriminator 76' is a slowly varying DC signal on line 88' which is proportional to the phase difference between the two input frequencies. The resulting signal is filtered by a low pass filter 90' to remove unwanted harmonics and then injected into oscillator 66' via line 92' to operate a frequency control system 93'. The control loop comprising elements 66', 74', 78', 80', 84', and 90' plus the required interconnections as shown in FIG. 3 is designed to synchronize oscillator 66' to a frequency which fulfills the condition $$f_2^* - f_1 = \frac{f_1 + f_s}{n}$$

or $n f_2^* = nf_1 + f_s + f_4$.

To ensure a phase-lock under all conditions and for various values of n discriminator 78' may be a combination frequency-phase discriminator which being well known in the art is not described. Such a circuit uses frequency discrimination to bring $f_2^* - f_1$ to a value close to $$\frac{(f_4 + f_s)}{n}$$

thereby ensuring both frequencies are within the lock-in range for phase discrimination. Thus, the output signal on line 88' is a voltage whose magnitude and polarity depends on the frequency and phase relationship of the signals fed into discriminator 78'.

Since $n f_2^* = nf_1 + f_s + f_4$ and $f_0^* = nf_1 + f_s$ the beat frequency $f_b$ produced by mixer 60' equals $f_4$. This is the condition required to enable emplifier 142 which in turn allows frequency control system 46' to phase-lock $f_0^*$ on the frequency $nf_1 + f_s$.

A consideration of great importance is whether or not a second condition for a stable phase-lock of $f_0^*$ on some other harmonic of $f_1$ exists within the frequency range of oscillator 16'. Such a secondary locking frequency could occur for the $(m + n)$th harmonic of $f_1$ if the following condition is fulfilled: $m(f_s + f_4) = n(f_s - f_4)$. The frequency $f_s - f_4$ represents an image frequency with respect to harmonics of the frequency spectrum whose fundamental frequency is $f_2^*$. An image rejection discriminator, familiar to those skilled in the art may be employed to prevent such a secondary phase-lock.

In those situations where the harmonics selected are not too high but a relatively large frequency range is desired it is possible to interlace the $f_4$ image frequencies with potential lock-in frequencies on harmonics of $f_1$ by suitably choosing $f_4$. However, in most cases where the frequency range of the controlled oscillator is not overly wide, secondary locking points may be kept outside the control range of the control oscillator by properly choosing the relationship between $f_s$ and $f_4$. For example, if $f_s$ is equal to approximately $2f_4$ the desired lock-in frequency and the undesired secondary lock-in frequency are in a ratio of 3:1 which in most applications exceeds the practical control range of controlled oscillator 16'.

Figure 4:
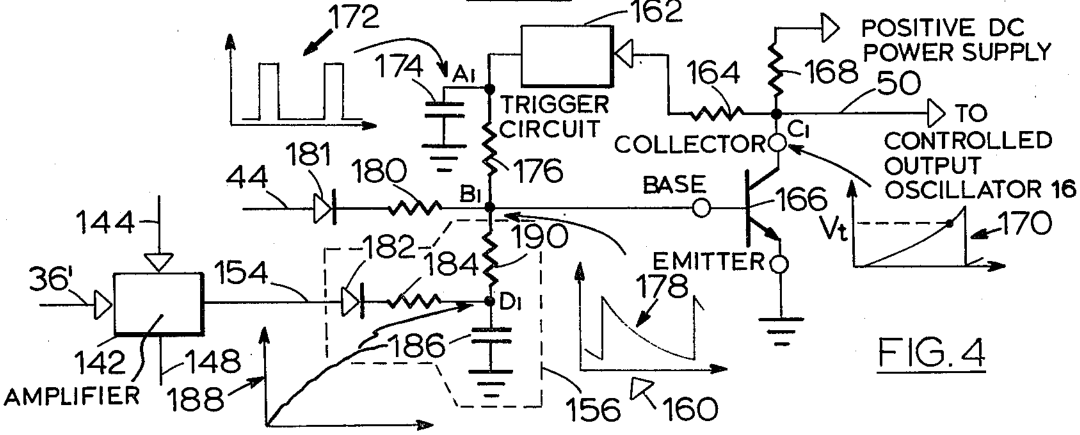
FIG. 4 is a combination block-schematic diagram of a hunting oscillator according to the present invention.

Reference is now made to FIG. 4 which shows in a combination block-schematic diagram a preferred embodiment of hunting oscillator 48, designated generally by the numeral 160. It will be appreciated that the description of hunting oscillator 48 applies directly to hunting oscillator 48' in FIG. 3.

A conventional trigger circuit 162 is triggered via resistor 164 when a voltage level $V_t$ occurs at point $C_1$ the collector of transistor 166. Point $C_1$ is also connected to resistor 168 which is connected to a positive DC voltage supply (not shown) and to frequency control system 46. During the hunting action a saw-tooth voltage, shown at 170 in FIG. 4, occurs at point $C_1$. The presence of saw-tooth voltage at point $C_1$ causes oscillator 16 to sweep across its frequency range. When the voltage at point $C_1$ exceeds a level $V_t$ pulse generator 162 is triggered and the process is repeated. However, when the hunting action ceases (to be described) the voltage at point $C_1$ becomes a slowly varying DC voltage and as such forms part of the phase-lock loop associated with oscillator 16.

The output from pulse generator 162 is a sharp positive going pulse 172. This pulse is directed to point $A_1$, in FIG. 4, where it rapidly charges capacitor 174. The capacitor then discharges via resistor 176 producing a decaying current, shown as waveform 178, at point $B_1$. When capacitor 174 is initially charged transistor 166 is turned ON causing the voltage at point $C_1$ to drop to ground potential (approximately 0 volts). As the current level at point $B_1$ decays towards zero transistor 166 slowly turns OFF causing the voltage at point $C_1$ to rise. When the voltage at point $C_1$ reaches the trigger level $V_t$ the trigger circuit produces another pulse and capacitor 174 is recharged thereby starting the cycle over.

The hunting action is inhibited when a phase-lock condition is approached by directing the signal on line 44 (see FIG. 1) to point $B_1$ via resistor 180 and diode 181. When mixer 24 is enabled the signal present on line 44 is rectified and adjusted in level by diode 181 and resistor 180 to generate a positive DC current level at $B_1$. This current level may be greater on smaller than the current level generated at $B_1$ by pulse generator 162. However, when mixer 24 is enabled the current level at point $B_1$ will not decay to zero. Consequently, when a signal is present on line 44 the collector of transistor 166 will not reach the trigger voltage $V_t$ and further triggering of circuit 168 is inhibited. The voltage which appears at point $C_1$ is now controlled by the signal on line 44. As a result the frequency of controlled oscillator 16 is controlled by the phase-lock system and frequency control system 46 causes oscillator 16 to lock onto the selected harmonic in the first harmonic spectrum.

A second input may be coupled into hunting circuit 160. The signal on input line 154 is generated internally in selective amplifier 142 (see FIG. 3) and may be employed as a means for slowing down the hunting action as a phase-lock is approached. A component of the output signal from amplifier 142 is rectified by diode 182 and fed to a filter comprising resistor 184 and capacitor 186. Thus, a signal having a waveform 188 appears at point $D_1$ when amplifier 142 is enabled. The signal at point $D_1$ is injected into point $B_1$ via resistor 180. The decaying current entering point $B_1$ from capacitor 174 via resistor 176 is combined with an increasing current entering point $B_1$ via resistor 190 resulting in a current level which either remains momentarily steady or decays at a slower rate. As a result the voltage level at the collector of transistor 166 increases at a slower rate or remains momentarily constant. This has the effect of slowing down or possibly stopping the hunting rate which facilitates phase-locking oscillator 16′ on the desired harmonic of $f_1$. It will be appreciated by those skilled in the art that the above means for slowing down the hunting rate can also be applied to the direct lock frequency synthesis system shown in FIG. 1.

Figure 5:
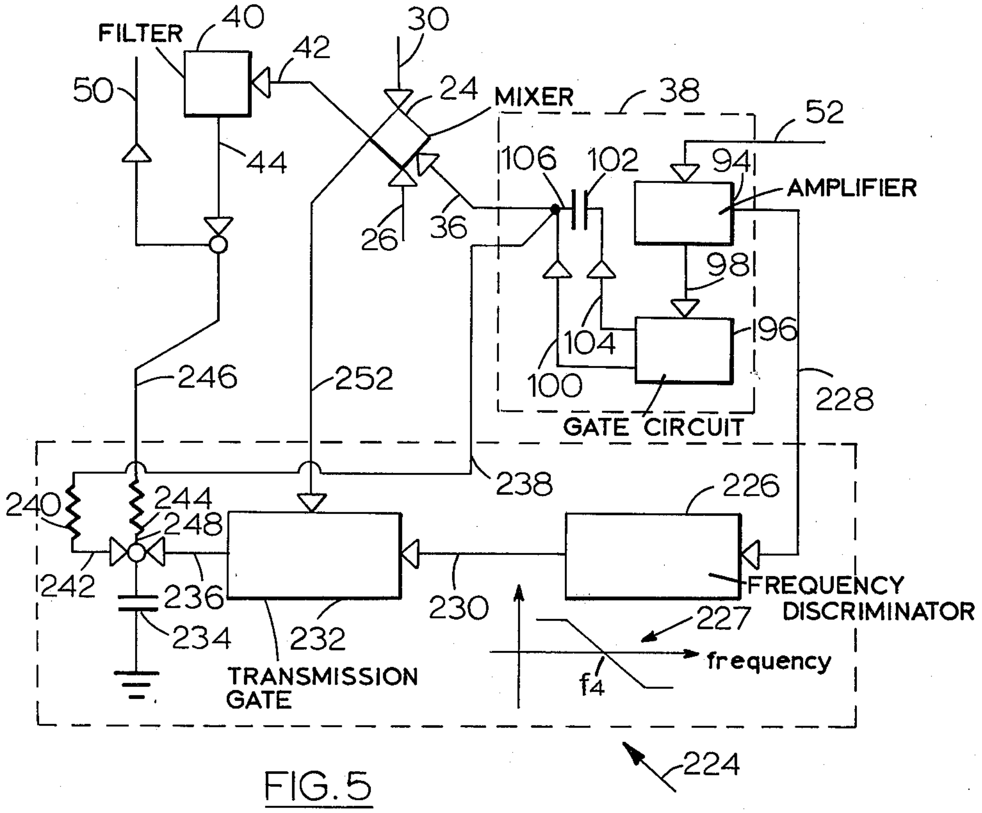
FIG. 5 is a block-schematic diagram of an improved hunting system shown connected to the frequency synthesis system in FIG. 1.

FIG. 5 shows an improved hunting system at reference numeral 224. Hunting system 224 provides a signal which controls the output frequency $f_0$ of oscillator 16 (see FIG. 1) in a manner adapted to sweep oscillator 16 in the direction of a newly selected frequency. In addition, to faciliate lock-in the hunting rate decreases as the selected harmonic frequency is approached. Consequently a substantial-reduction in lock-in time may be achieved.

The description of the operation of hunting system 224 will be made with reference to its application to the frequency synthesis system shown in FIG. 1 (part of FIG. 1 is reproduced in FIG. 5 for convenience). It will be appreciated by those skilled in the art that the hunting system to be described can with appropriate modifications be used in the frequency synthesis system shown in FIG. 3 and in other related applications.

Hunting system 224 makes use of the relative positions of the harmonics contained in the second harmonic spectrum and the harmonics contained in the first harmonic spectrum to determine the direction and the amplitude of the hunting signal which in turn controls the direction and rate at which oscillator 16 is swept through its frequency range. As previously described the auxiliary frequency harmonics $n \cdot f_2$ are lower in frequency than their associated primary frequency harmonics $n \cdot f_4$ for the selected harmonic of $f_1$ on which oscillator 16 is to be phase-locked. If $n_x$ is the particular harmonic number on which oscillator 16 is phase-locked so that $f_{0x} = n_x f_1$ and $f_4 = n_x (f_1 - f_2)$, the associated harmonics of $f_1$ and $f_2$ below harmonic number $n_x$ are separated by a frequency difference less than the frequency $f_4$ and those above harmonic number $n_x$ are separated by a frequency difference greater than the frequency $f_4$. If a new frequency is selected which is higher than the first frequency $n_x \cdot f_1$ so that $f_{0hx} = n_{hx} \cdot f_1$ where $f_{0hx}$ is greater than $f_{0x}$ and $n_{hx}$ is greater than $n_x$ the harmonics of $f_2$ will shift upwards in frequency so that $f_4 = n_{hx} \cdot (f_1 - f_2)$. Conversely for $f_{01x} = n_{1x} \cdot f_1$ where $n_{1x}$ is less than $n_x$ and $f_{01x}$ is less than $f_x$, the harmonics of $f_2$ shift downwards in frequencey so that $f_4 = n_{1x} \cdot (f_1 - f_2)$. Consequently, when a new frequency is selected the beat frequency $f_b$ between $f_0$ and the harmonics of $f_2$ will vary above and below the gate centre frequency $f_4$ until a phase-lock condition is established. The beat frequency $f_b$ will be less than $f_4$ if $f_0$ is to be locked onto a new frequency having a harmonic number higher than the original harmonic number and greater than $f_4$ if $f_0$ is to be phase-locked onto a new frequency having a lower harmonic number. The magnitude of $f_b$ relative to the frequency $f_4$ when $f_0$ passes a harmonic of $f_1$ is used to determine the rate and the direction of the hunting signal which in turn controls the rate and direction of the frequency sweep of oscillator 16.

Reference is now made to FIG. 5 to describe hunting system 224 in detail. A conventional frequency discriminator 226 having a centre frequency $f_4$ and a typical s-shaped transfer characteristic 227 derives its input signal on line 228 from tuned amplifier 94. The signal on line 238 is identical to the signal on line 98 and is confined to a frequency range $f_4 \pm (b/2) \cdot (f_4/n)$ where $n$ is the highest harmonic of $f_1$ on which a phase-lock condition is required. The output signal of frequency discriminator 226 appears on line 230 and comprises a DC signal having a positive or negative polarity which is amplified and adjusted to an appropriate level by conventional circuitry (not shown). The signal on line 230 is directed to a transmission gate 232 (to be described) which when enabled directs this signal to storage element 234 via line 236. Storage element 234 in its simplest form may be a capacitor, however, a conventional integrator circuit may also be used.

The signal on line 36 is directed via line 238, resistor 240 and line 242 to element 234. As lone as gate 38 is enabled, a condition which exists when oscillator 16 is phase-locked onto the selected harmonic of the primary reference frequency, a signal voltage is present on line 238. This signal voltage provides a current via resistor 240 creating an offset voltage across storage element 234. The control signal voltage on line 50 causes a current, limited by resistor 244, to flow along line 246 to resistor 244, and along line 248 to storage element 234. Resistors 240 and 244 are selected so that the currents on lines 244 and 248 cancel when oscillator 16 is phase-locked on the selected harmonic in the first harmonic spectrum. Consequently the frequency of oscillator 16 is controlled exclusively by the signal on line 44 which is coupled via line 50 to frequency control system 46.

The purpose of resistor 240 is to cause an initial shift in the control voltage on line 50 upon the selection of a new output frequency. When a new output frequency is selected the absence of a signal on line 238 causes an initial change in the control voltage on line 246 thereby causing a sufficient frequency shift in the output frequency of oscillator 16 to ensure an encounter with a harmonic of $f_1$. Once such an encounter has occurred the sweep action is sustained (to be described) until a phase-lock condition has been achieved.

When a new output frequency is selected the output signal on lines 36 and 238 disapperar causing transmission gate 232 to close. The voltage on storage element 234 is directed to oscillator 16 via lines 248, 246 and 50 and resistor Z 44. The resulting signal on line 50 causes the frequency of oscillator 16 to shift. Assuming for the present that the frequency of oscillator 16 shifts in the desired direction the operation of hunting system 224 may be described as follows.

The decreasing voltage on storage element 234 causes the frequency of oscillator 16 to approach a harmonic of the frequency $f_1$. As $f_0$ approaches the associated harmonic of the frequency of $f_2$ the beat signal $f_b$, having a frequency in the vicinity of frequency $f_4$, appears at the output of tuned amplifier 94. This in turn results in an output from discriminator 226 which will be directed to element 234 via transmission gate 232 the moment the transmission gate is enabled.

The enable signal for gate 232 is generated by mixer 24. When the frequency of oscillator 16 is such that $f_b = f_4 \pm (b/2) \cdot (f_4/n)$ an enable signal will appear on line 36 turning mixer 24 on. The AC beat signal from mixer 24 is amplified (not shown) and directed to gate 232 via line 252. When enabled (to be described) gate 232 passes the signal on line 230 to line 236 which allows the storage element 234 to be charged to the voltage level existing at the output of discriminator 226 at that particular instant. However, the conditions described are only transistory unless $f_b = f_4$. If this condition does not exist oscillator 16 will sweep past that particular harmonic of $f_1$ and mixer 24 will be inhibited thereby closing gate 232. The change voltage on element 234 causes oscillator 16 to continue to sweep across its frequency range.

The polarity of the output signal produced by discriminator 226 depends on the relative positions of the output frequency of oscillator 16 and the selected harmonic frequency. If the frequency of oscillator 16 is higher than the selected harmonic frequency the frequency discriminator output voltage on line 230 is negative and for the opposite condition the signal on line 230 is positive. In addition, the magnitude of the signal on line 230 decreases as the frequency of oscillator 16 approaches the selected harmonic frequency. The declining signal level on line 230 results from gate 232 being enabled when $f_0$ is very near a harmonic of $f_1$. As the selected harmonic frequency is approached the beat frequecny signal on lines 228 and 98 simultaneously approaches the frequency $f_4$. As the frequency of the signal on line 228 approaches the frequency $f_4$ the output voltage from frequency discriminator 226 steadily declines towards zero volts.

The hunting rate and the sweep rate of oscillator 16 are thereby maintained at a relatively high level until the desired harmonic is approached at which time the sweep rate approaches zero thereby providingng ideal conditions for a for a phase-lock.

If the frequency of oscillator 16 sweeps past the selected harmonic of $f_1$ the beat frequency $f_b$ will move away from $f_4$ in the opposite direction resulting in a change in the polarity of the signal on line 230 which in turn causes the frequency of oscillator 16 to start sweeping in the opposite direction. When a phase-lock occurs the beat signal on line 252 is zero since $f_0 = n \cdot f_1$ and gate 232 is closed since no beat signal is present. The voltage on elment 234 will stabilize at a level determined by the voltage on lines 50 and 238 resulting in oscillator 16 being controlled by the phase-lock loop in the manner described above.

If the frequency of oscillator 16 begins to sweep in the wrong direction subsequent to the selection of a new output frequency the sweep direction will be corrected as soon as $f_0$ encounters a harmonic of $f_1$. In this situation the beat frequency $f_b$ between $f_0$ and the associated harmonic $f_2$ would be increasingly further removed from $f_4$ at the moment $f_0$ encounters a harmonic of $f_1$ and gate 232 is enabled. Under these conditions the output polarity of discriminator 226 will cause hunting system 224 to drive oscillator 16 in the opposite direction causing the beat frequency $f_b$ to approach $f_4$.

Figure 6:
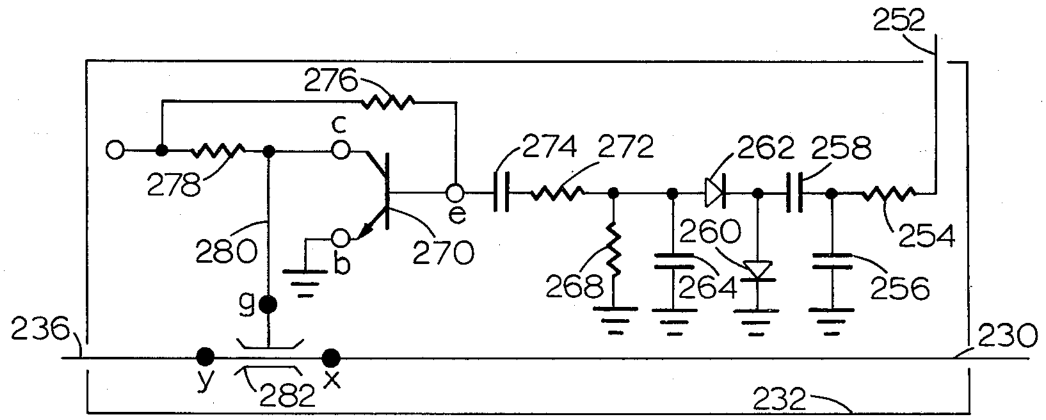
FIG. 6 is a schematic diagram of a signal transmission gate used in FIG. 5.

Reference is next made to FIG. 6 which shows in schematic form a preferred embodiment of transmission gate 232. As described above transmission gate 232 provides a means of connecting output of discriminator 226 to storage element 234 at the appropriate instant.

The enable-disable signal applied to gate 232 is derived from mixer 24 via line 252. The signal on line 252 is the beat signal between $f_0$ and the various harmonics of $f_1$. This signal is filtered by a low-pass filter comprising a resistor 254 and a capacitor 256 to prevent high frequency signal components in the primary reference frequency spectrum form operating gate 232. The filtered beat signal is coupled to a rectifier circuit consisting of diodes 260, 262, by a capacitor 258. The rectified signal is filtered by a capacitor 264 and a resistor 268 and is coupled into the base of transistor 270 by a resistor 272 and a capacitor 274 The presence of this signal causes a transistory negative bias on the base of transistor 270.

In the absence of a signal on line 252 the base of transistor 270 held in a forward bias condition by a resistor 276. Resistor 276 is connected to a positive DC power supply (not shown). Consequently, transistor 270 is normally held in an ON condition and the collector of transistor 270 has low positive DC potential due to the voltage drop across resistor 278. When a signal appears on line 252 the negative bias coupled into the base of transistor 270 causes the transistor to turn OFF and the collector potential rises to a level of the positive power supply to which resistor 278 is connected.

The collector of transistor 270 is connected to a lead 280 of a transistor gate 282 familiar to those skilled in the art. The transistor gate 282 provides an isolated transmission path between points X and Y (see FIG. 6). When transistor 270 is OFF a condition which occurs when a signal is present on line 252, the positive potential on line 280 causes the impedance between points X and Y to drop drastically. The reduced impedance between points X and Y allows the output signal from discriminator 226 to charge storage element 234 via lines 230 and 236 to the potential existing on line 230 at that instant. consequently, as oscillator 16 sweeps through its frequency range each time $f_0$ encounters a harmonic in the first harmonic spectrum transistor gate 282 allows discrimintor 226 to charge storage element 234 to the level existing at the output of the discriminator. As soon as $f_0$ passes that particular harmonic gate 232 closes and the signal stored on storage element 234 begins to decay. As the voltage decays it continues to sweep oscillator 16 at a rate and in a direction determined by the level and polarity of the voltage on storage element 234.

As the correct frequency is approached the output of frequency discriminator 226 approaches zero causing the hunting rate to decrease and allowing a phase-lock to occur.

In the frequency synthesis systems described above, with reference to FIGS. 1 and 3 each system is based on the phase-lock of a controllable oscillator having an output signal frequency equal to a selected harmonic of the primary reference frequency $f_1$. Restricting the phase-lock to a specific harmonic frequency is accomplished by employing a controllable auxiliary oscillator which is coupled to a second pulse generator for generating the second frequency spectrum. The frequency of the auxiliary oscillator is varied by means of a programmable oscillator and programmable frequency divider. When the output signal frequency $f_0$ equals the selected harmonic of frequency $f_1$ the beat frequency $f_b$ between $f_0$ and a harmonic in the second harmonic spectrum corresponds to the gate enable frequency $f_4$. When this condition is satisfied the phase-lock system which permits the controlled oscillator to lock onto the selected harmonic of the reference frequency $f_1$ is enabled.

Figure 7:
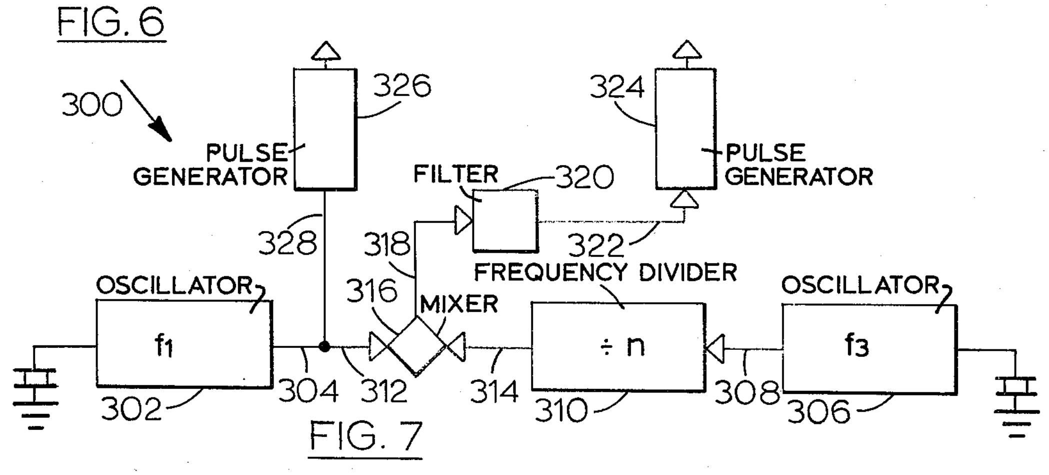
FIG. 7 is a partial block diagram of an alternate means for creating an auxiliary frequency source.

Reference is now made to FIG. 7 which shows at reference numeral 300, a block diagram of an alternate means for generating auxiliary frequency $f_2$. The discussion to follow will be restricted to the signal generated by oscillator 66 (see FIG. 1), however, it will be apparent to those skilled in the art that the system to be described is also applicable to a frequency synthesis system employing an offset frequency as discussed above and shown in FIG. 3.

A crystal controlled reference oscillator 302 which corresponds to oscillator 12 in FIG. 1 generates primary reference frequency $f_1$ on line 304. A crystal controlled programming oscillator 306 generates a signal of frequency $f_3$ which is fed via line 308 to a programmable divider 310 which divides the input signal by a factor $n$. Elements 306, 308 and 310 in FIG. 7 correspond to elements 80, 82, 84 shown in FIG. 1. The signals on lines 312 and 314 are fed to a conventional mixer 316. In FIG. 1 these elements correspond to elements 70, 72 and 74. The output signal from mixer 316 appears on line 318 and contains the frequencies $f_1$, $f_1 \pm (f_3/n$ and $f_1 - f_4./n$ This signal is then fed to filter 320 which filters out the frequencies $f_1$ and $f_1 \pm f_4./n$ Consequently, the output from filter 320, on line 322, in a signal having a frequency $f_1 - f_3/n$ ) which corresponds to the desired value of $f_2$. Thus, a pulse train having a fundamental frequency $f_2$ appears at the output of pulse generator 324 which corresponds to pulse generator 56 in FIG. 1.

The ouput from oscillator 302 is also fed to pulse generator 326 via lines 304 and 328 which corresponds to pulse generator 18 and lines 20 and 22 respectively. The remainder of the system (not shown) is identical to the system shown in FIG. 1.

A practical use for an offset frequency synthesis system is in the local oscillator of a television receiver. For example, a television receiver operating on the standard NTSC system will have all of its VHF channels with the exception of irregular channels 5 and 6 located 1 MHz offset from harmonics of 6 MHz. Channels 2, 3 and 4 are related to the 17th, 18th and 19th harmonics of 6 MHz and channels 7 through 13 are related to the 37th, through 43rd harmonics of 6 MHz. All UHF channels are located +1 MHz offset from harmonics of 6 MHz. Thus UHF channels 14 through 82 are related to harmonics 86 through 154 of 6 MHz.

If $f_4$ is chosen as 0.333 MHz then the ratio $$\frac{f_s + f_4}{f_s - f_4} = \frac{1.333}{.667}$$

or approximately 2 which is substantially more than the frequency ratio of the VHf oscillator which is $$\frac{154 \ . \ (6+1)}{84 \ . \ (6+1)}$$

or 1.89. The ratios for the UHF bands are even less. Consequently, in all cases the potential secondary lock-in frequencies are well outside the control range of the output oscillator and hence no special steps need be taken to avoid secondary lock-in.

For the highest division ratio $n$ (corresponding to the 154th harmonic of 6 MHz) and setting the frequency of oscillator 80′ to $f_s + f_4 = 1.333$ MHz the maximum possible gate bandwidth can be computed using the formula previously developed:

$$\frac{(f_4 + f_s)}{n} \geq \frac{b}{2}(f_1 + f_2)$$

which results in a bandwidth of 8.6 KHz. This represents 2.4 percent of the gate frequency $f_4$ and as such is a practical bandwidth to employ.

The above example shows that for the highest harmonics of the UHF range the difference frequency $f_2^* - f_1$ is approximately 8.6 KHz. As a result phase discriminator 78′ will be required to operate at a relatively low frequency which may create problems in designing filter 90′ which feeds the frequency control system of oscillator 66′. A known method of overcoming this problem is to have oscillator 80′ operate on a harmonic of $f_2^* - f_1$. If for example the third harmonic is used, then $$\frac{f_s + f_4}{n} = 3 \times (f_2^* - f_1)$$

resulting in an output signal from divider 84′ whose frequency is approximately 25.5 KHz. In this case mixer 74′ does not operate directly from signals of frequency $f_1$ and $f_2^*$, generated by oscillators 12′ and 66′ respectively, but rather the mixer is supplied with the third harmonic of these frequencies generated by filtering (not shown) the output signals from pulse generators 18′ and 56′ respectively. This method while requiring some additional filtering substantially eases the problems related to the design of the phase-lock system associated with oscillator 66′.

What I claim is:

1. a frequency synthesis system including:

1. means for producing a first harmonic spectrum containing harmonics of a primary reference frequency;
2. a controllable oscillator for generating a first output signal of variable frequency $f_0$ and including a first frequency control means for tuning said controllable oscillator over a predetermined frequency range and for locking said first output signal to a predetermined frequency, said frequency range including a selected portion of said harmonic spectrum;
3. first circuit means coupled to said controllable oscillator and to said means (1) for comparing the phase of said first output signal with the signal generated by said means (1) and operable to produce a first control signal having an amplitude dependent on the relative phase difference between said first output signal and the signal generated by said means (1), said amplitude having a unique value when the frequency difference beween said first output signal and a selected harmonic in said first harmonic spectrum has a desired value;
4. said first frequency control means being connected to said first circuit means and being responsive to said first control signal for establishing the frequency of said first output signal at said predetermined frequency when said first control signal has said unique value;
5. sweeping means coupled to said first frequency control means and operably by said first control signal for sweeping the frequency of said first output signal across said first harmonic spectrum when said first output signal frequency is different from said predetermined frequency;
6. controllable signal generator means for producing a second harmonic spectrum containing harmonics of an auxiliary reference frequency;

7. a second frequency control means having first and second signal inputs connected to said means (1) and to said means (6) for comparing the frequency difference between the output signal frequency of said means (1) and (6) with sub-harmonics of a programmed reference signal having a frequency equal to a first selected fixed frequency and for generating a second control signal; said second control signal being coupled to said means (6) for controlling said second harmonic spectrum so that the harmonics in said second harmonic spectrum have a predetermined relationship with the harmonics in said first harmonic spectrum and one specific harmonic in said second harmonic spectrum differs in frequency from said selected harmonic in said first harmonic spectrum by said first selected fixed frequency;

8. second circuit means coupled to said controllable oscillator and to said means (6) for mixing said first output signal with frequencies in said second harmonic spectrum to produce a second output signal having a frequency equal to a second selected fixed frequency when said specific harmonic in said second harmonic spectrum differs in frequency from the frequency of said first output signal by an amount equal to said first selected fixed frequency; and 9. gate means coupled to said means (8) and responsive to said second output signal and coupled to said means (3) for producing a third control signal to enable said means (3) when the frequency of said second output signal is within a predetermined frequency range centered about a frequency equal to said second selected frequency, whereby said means (3) is enabled and generates said first control signal thereby establishing the frequency of said first output signal at said predetermined frequency.

2. A frequency synthesis system as claimed in claim 1, in which said first output signal has a frequency equal to the frequency of said selected harmonic in said first harmonic spectrum when said first control signal has said unique value and said first selected fixed frequency is equal to said second fixed frequency.

3. A frequency synthesis system as claimed in claim 2, in which said first circuit means includes sampling gate means for producing a third output signal having an amplitude which varies with the relative temporal positions of said first output signal and the the signal generated by said means (1) and first control signal generating means for filtering and rectifying said third output signal to produce said first control signal.

4. A frequency synthesis system as claimed in claim 1, in which the frequency of said first output signal is displaced by a preselected offset frequency from the frequency of said selected harmonic spectrum when said first control signal has said unique value and said first selected fixed frequency is different from said second selected fixed frequency by an amount equal to said offset frequency.

5. A frequency synthesis system as claimed in claim 4, in which said first circuit means includes signal mixing means coupled to said means (1) and to said controllable oscillator for generating a fourth output signal, a crystal controlled oscillator having a frequency equal to said preselected offset frequency, a variable gain narrow band tuned amplifier tuned to a centre frequency equal to said offset frequency and controllable from a low gain to a high gain condition by said third control signal to generate a fifth output signal, a phase discriminator for generating a sixth output signal, filtering and rectifying circuit means for generating said first control signal, means coupling said fourth output signal to said narrow band tuned amplifier, means to couple said fifth output signal and signal derived from said crystal controlled oscillator to said phase discriminator and means to couple said sixth output signal to said filtering and rectifying circuit means generates whereby an output signal which corresponds to said first control signal.

6. A frequency synthesis system as claimed in claim 1, in which said sweeping means includes a hunting oscillator operable in a hunting mode and in a phase-lock mode, said hunting oscillator including means operable when said hunting oscillator is in said hunting mode for generating a repetative saw-tooth signal with a predetermined peak amplitude and frequency and having a fast rising portion and a relatively slowly decaying portion, the sweep rate of said controllable oscillator being dependent on said slowly decaying portion, said hunting oscillator including means operable when said hunting oscillator is in said phase-lock mode to inhibit the generation of said saw-tooth signal and to couple said first control signal to said controllable oscillator.

7. A frequency synthesis system as claimed in claim 6 in which said hunting oscillator is operable in said hunting mode when said output signal frequency generated by said controllable oscillator is remote from said selected harmonic in said first harmonic spectrum and is operable in said phase-lock mode when the frequency of said first output signal is equal to said predetermined frequency.

8. A frequency synthesis system as claimed in claim 1 in which said sweeping means includes:

1. a narrow band amplifier coupled to said second circuit means and responsive to said second output signal for generating a seventh output signal, said narrow band amplifier having a predetermined bandwidth tuned to a centre frequency equal to said second selected fixed frequency;
2. a frequency discriminator having a centre frequency equal to said second fixed frequency coupled to the output of said narrow band amplifier and responsive to the frequency of said seventh output signal for producing a dual polarity DC output signal for input signals having a frequency respectively above and below said second fixed frequency;
3. a transmission gate operable by said first control signal and means coupling said transmission gate through the output of said frequency discriminator;
4. voltage storage means connected to the output of said transmission gate;
5. means for deriving a signal from said second control signal and means for coupling said derived signal to said storage element; and
6. means for deriving a signal from said storage element and means for coupling said derived signal to said controllable oscillator.

9. A frequency synthesis system as claimed in claim 1, in which said gate means includes a narrow band amplifier having a predetermined bandwidth tuned to a centre frequency equal to said second selected fixed frequency, and a gating circuit coupled to said narrow band amplifier for producing said second control signal.

10. A frequency synthesis system as claimed in claim 9, in which said bandwidth of said narrow band amplifier is equal to or less than said second selected fixed frequency divided by $n_{max}$ where $n_{max}$ is the highest harmonic of said first harmonic spectrum on which said controllable oscillator is to be phase-locked.

11. A frequency synthesis system as claimed in claim 1, in which said gate means includes a frequency selective gate having two pass bands, each tuned to and symetrical about said second selected fixed frequency, in which the bandwidth of said first pass band is wider than the bandwidth of said second pass band, said gate means further including means responsive to said second output signal for momentarily generating said third control signal when said second output signal has a frequency within the limits of said first pass band and for generating said third control signal continuously when said second output signal has a frequency within the limits of said second pass band, whereby said third control signal enables said means (3) causing said means (3) to produce said first control signal momentarily when said second output signal frequency lies within said first pass band and causing said means (3) to produce said first control signal continuously when said second output signal frequency lies with said second pass band.

12. A frequency synthesis system as claimed in claim 1, in which said means (1) includes a primary reference frequency oscillator for generating said primary reference frequence and said means (6) includes a controllable auxiliary reference frequency oscillator for generating said auxiliary reference frequency.

13. A frequency synthesis system as claimed in claim 12, in which said means for generating said second harmonic spectrum includes said controllable auxiliary reference frequency oscillator, third frequency control means responsive to the output of said second frequency control means for controlling the output signal frequency of said controllable auxiliary reference frequency oscillator over a predetermined limited frequency range and a pulse generator coupled to the output signal of said controllable auxiliary reference frequency oscillator for generating a pulse train having a high harmonic content.

* * * * *